United States Patent
An et al.

(10) Patent No.: US 9,263,148 B2
(45) Date of Patent: Feb. 16, 2016

(54) SEMICONDUCTOR DEVICE WITH PASS/FAIL CIRCUIT

(71) Applicant: SK hynix Inc., Gyeonggi-do (KR)

(72) Inventors: Chi Wook An, Gyeonggi-do (KR); Min Kyu Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,071

(22) Filed: Dec. 16, 2014

(65) Prior Publication Data

US 2015/0364208 A1     Dec. 17, 2015

(30) Foreign Application Priority Data

Jun. 13, 2014   (KR) .......................... 10-2014-0072208

(51) Int. Cl.
*G11C 16/04*  (2006.01)
*G11C 16/34*  (2006.01)
*G11C 16/12*  (2006.01)
*G11C 16/10*  (2006.01)

(52) U.S. Cl.
CPC ............ *G11C 16/3459* (2013.01); *G11C 16/12* (2013.01); *G11C 16/10* (2013.01); *G11C 16/3454* (2013.01)

(58) Field of Classification Search
CPC ............... G11C 16/10; G11C 16/0483; G11C 11/5628; G11C 16/3454; G11C 16/3459
USPC ............ 365/185.19, 185.22, 185.09, 185.18, 365/185.24
See application file for complete search history.

(56) References Cited

U.S. PATENT DOCUMENTS 8,493,792 B2 *   7/2013   Aritome ............. G11C 11/5628
                                                                365/185.03

FOREIGN PATENT DOCUMENTS

| KR | 1020090052506 | 5/2009 |
|----|---------------|--------|
| KR | 1020100086681 | 8/2010 |
| KR | 1020100106760 | 10/2010 |
| KR | 1020100115111 | 10/2010 |

* cited by examiner

*Primary Examiner* — David Lam
(74) *Attorney, Agent, or Firm* — IP & T Group LLP (57) ABSTRACT

A semiconductor device includes a memory block including memory cells coupled to word lines, and an operation circuit suitable for performing a program operation and a verify operation on memory cells coupled to a selected word line, wherein, when performing the program operation, the operation circuit applies a first program allowance voltage to a bit line of a first program fail cell to keep a program fall status, and a second program allowance voltage having a voltage level different from the first program allowance voltage to a bit line of a second program fail cell to change a program pass status to a program fail status.

20 Claims, 9 Drawing Sheets

SEMICONDUCTOR DEVICE WITH PASS/FAIL CIRCUIT

CROSS-REFERENCE TO RELATED APPLICATION

The present application claims priority to Korean patent application number 10-2014-0072208, filed on Jun. 13, 2014, the entire disclosure of which is herein incorporated by reference in its entirety by reference.

BACKGROUND

Field of Invention

Various embodiments of the present invention relate to a semiconductor device, and more particularly, to a semiconductor device including memory cells.

In a semiconductor device, such as a flash memory, data is stored in a flash memory cell through a program operation, and to check whether the data is stored in the flash memory cell a verify operation is performed. When the program operation is performed, a threshold voltage of the programmed memory cell is increased. If the threshold voltage is increased higher than a target level, it is determined that the data is stored in the flash memory cell.

However, even when the threshold voltage is lower than the target level, the threshold voltage may be determined to be higher than the target level in the verify operation for various reasons, such as, a source bouncing phenomenon. Additionally, when the threshold voltage is increased higher than the target level, if a difference between the threshold voltage and the target level is not large enough, the threshold voltage may be determined to be lower than the target level.

In this regard, the data stored in the memory cell may be changed, and operational reliability of the flash memory may deteriorate.

SUMMARY

Various embodiments of the present invention are directed to a semiconductor device that may improve operational reliability.

According to an embodiment of the present invention, a semiconductor device may include a memory block including memory cells coupled to word lines, and an operation circuit suitable for performing a program operation and a verify operation on memory cells coupled to a selected word line, wherein, when performing the program operation, the operation circuit applies a first program allowance voltage to a bit line of a first program fail cell to keep a program fall status, and a second program allowance voltage having a voltage level different from the first program allowance voltage, to a bit line of a second program fail cell to change a program pass status to a program fail status.

According to an embodiment of the present invention a semiconductor device may include a memory block including memory cells coupled to word lines, and an operation circuit suitable for performing a program operation and a verify operation on memory cells coupled to a selected word line, wherein, when a verify operation detects that a first program fail cell has a program fall status, and a second program fail cell changed from a program pass status to a program fail status, the operation circuit applies a first program voltage to program the second program fail cell and a second program voltage to program a first program fail cell to the selected word line in the program operation.

DETAILED DESCRIPTION

Hereinafter, various embodiments will be described in detail with reference to the accompanying drawings. The figures are provided to allow those with ordinary skill in the art to understand the scope of the embodiments of the invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art. Throughout the disclosure, like reference numerals refer to like parts throughout the various figures and embodiments of the present invention.

In the drawings, a thicknesses and lengths of components are exaggerated compared to actual physical thickness and intervals for convenience of illustration. In the following description, a detailed explanation of known related functions and constitutions may be omitted to avoid unnecessarily obscuring the subject manner of the present invention. Furthermore, "connected/coupled" represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

Figure 1:
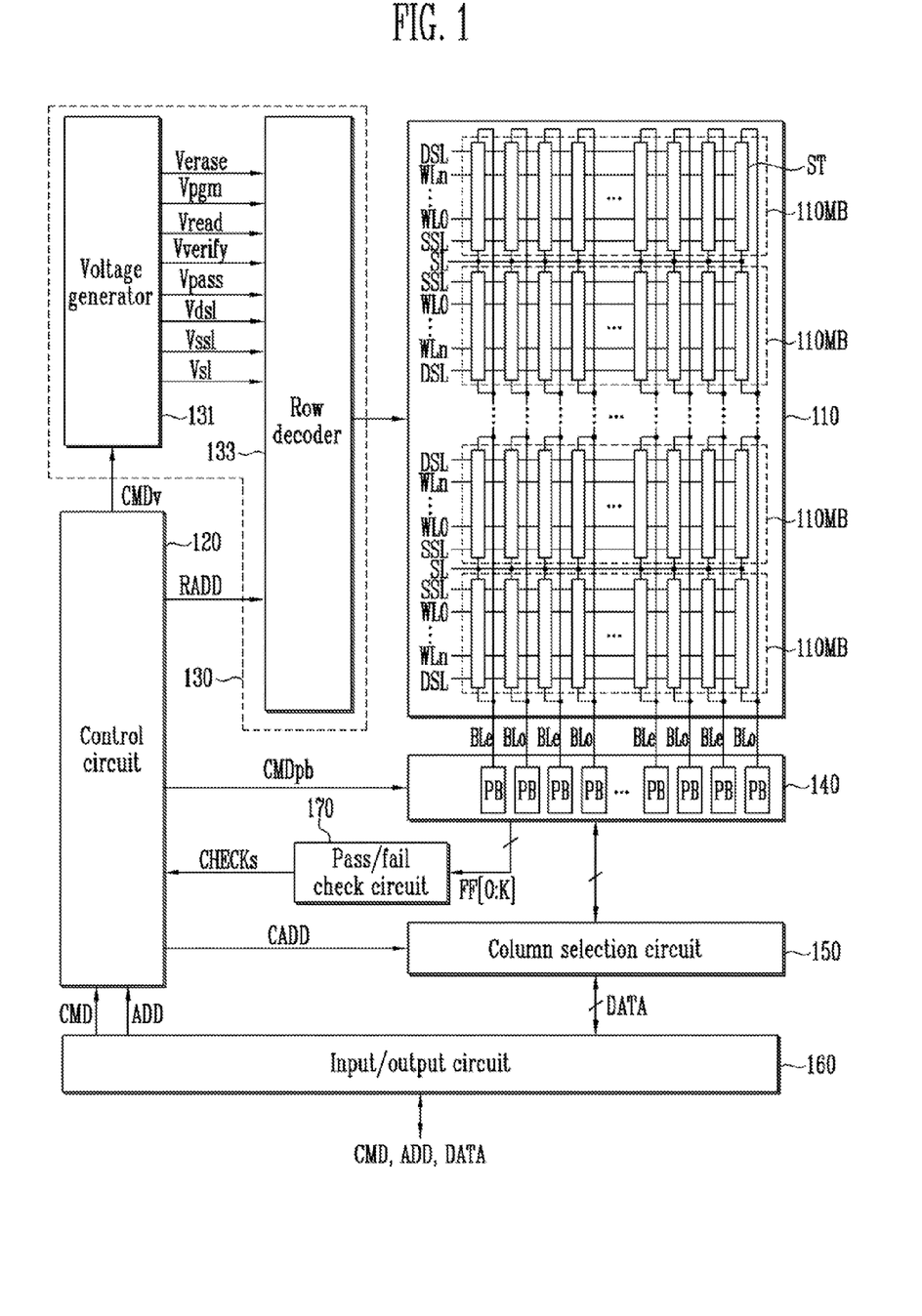
FIG. 1 is a block diagram illustrating a semiconductor device according to an embodiment of the present invention.

FIG. 1 is a block diagram illustrating a semiconductor device according to an embodiment of the present invention.

Referring to FIG. 1, the semiconductor device may include a memory array 110 and an operation circuit 120 to 170.

The memory array 110 may include a plurality of memory blocks 110MB.

Figure 2:
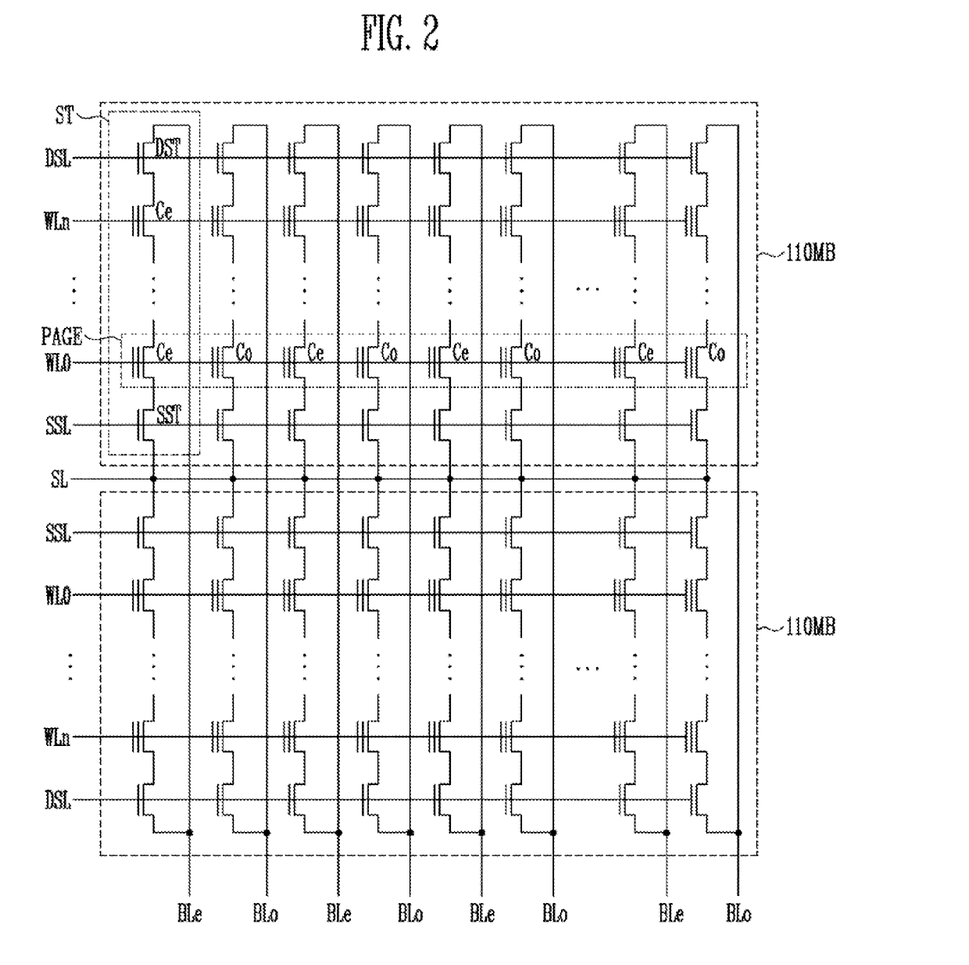
FIG. 2 is a diagram of a memory array shown in FIG. 1.

FIG. 2 is a detailed diagram of the memory array 110 shown in FIG. 1.

Referring to FIG. 2, each of the memory blocks 110B may include a plurality of memory strings ST coupled between bit lines BLe and BLo and a common source line SL. That is, the memory strings ST may be coupled to the bit lines BLe and BLo, respectively, and coupled in common to the common source line SL. Each of the memory string ST may include a source selection transistor SST having a source coupled to the common source line SL, a cell string including a plurality of memory cells Ce coupled in series with each other, and a drain selection transistor DST having a drain coupled to the bit line BLe. The memory cells Ce included in the cell string may be coupled in series between the selection transistors SST and DST. A gate of the source selection transistor SST may be coupled to a source selection line SSL. Gates of the memory cells Ce may be coupled to word lines WL0 to WLn, respectively. A gate of the drain selection transistor DST may be coupled to a drain selection line DSL.

The drain selection transistor DST may control connection between the cell string Ce and the bit line BLe. The source selection transistor SST may control connection or disconnection between the cell string Ce and the common source line SL.

In a NAND type flash memory, memory cells included in a memory cell block may be divided into physical page units or logical page units. For example, the memory cells Ce and Co coupled to a single word line, such as, WL0, may form a single physical page PAGE. Even memory cells Ce coupled to a single word line, such as, WL0, may form an even page. Odd memory cells Co may form an odd page. This page, whether it is an even page or an odd page, may be a basic unit for a program operation a read operation.

Referring again to FIG. 1, the operation circuit 120 to 170 may perform a program loop, an erase loop and a read operation on the memory cells Ce and Co coupled to a selected word line, such as, WL0. The program loop may include a program operation and a verify operation. The erase loop may include an erase operation and a verify operation.

The operation circuit 120 to 170 may perform the program loop by using an increment step pulse program (ISPP) method. That is, the operation circuit 120 to 170 may repeat the program operation and the verify operation until a threshold voltage of each of the memory cells Ce and Co coupled to the selected word line, such as, WL0, reaches a target level. The operation circuit 120 to 170 may repeat the program operation to store data and the verify operation to check whether the data is stored until it is determined that externally input data is stored in the memory cells Ce and Co of the selected word line such as, WL0.

The operation circuit 120 to 170 may increase a program voltage Vpgm applied to the selected word line by a predetermined step voltage each time the program operation is performed. That is, the operation circuit 120 to 170 may apply a program voltage Vpgm to the selected word line WL0, which is higher than the program voltage that was used in the previous program operation, by the predetermined step voltage.

When a first program fail cell which is checked as a program fall in the current verify operation, and a second program fail cell which is checked as a program pass in the previous verify operation, then subsequently checked as a program fail in the current verify operation, are detected, the operation circuit 120 to 170 may continue to randomly apply a first program voltage to program the second program fail cell and a second program voltage to program the first program fail cell to the selected word line during the program operation.

To perform the program loop, the erase loop and the read operation, the operation circuit 120 to 170 may selectively output operating voltages Verase, Vpgm, Vread, Vverify, Vpass, Vdsl, Vssl, and Vsl to local lines SSL, WL0 to WLn, and DSL and the common source line SL of a selected memory block, control precharge/discharge of the bit lines BLe and BLo, or sense a current flow of the bit lines BLe and BLo. For example, during an erase operation, an erase voltage Verase may be applied to a bulk, such as, a substrate or a P well, in which the memory cells are formed. The program voltage Vpgm may be applied to the selected word line during the program operation. A read voltage Vread may be applied to the selected word line during the read operation. A verify voltage Vverify may be applied to the selected word line during the verify operation. A pass voltage Vpass may be applied to unselected word lines during the program operation, the read operation, or the verify operation. A drain selection voltage Vdsl may be applied to the drain selection line DSL. A source selection voltage Vssl may be applied to the source selection line SSL. A source voltage Vsl may be applied to the common source line SL.

When the program operation is performed, the operation circuit 120 to 170 may apply a first program allowance voltage to a bit line of the first program fail cell checked as a program fail in the verify operation, and apply a second program allowance voltage to a bit line of the second program fail cell, which is checked in the previous verify operation as a program pass and subsequently checked as the program fail in the current verify operation. A detailed description thereof is given below with reference to FIG. 4.

In a NAND type flash memory, the operation circuit may include a control circuit 120, a voltage supply circuit 130, a read/write circuit group 140, a column selection circuit 150, an input/output circuit 160 and a pass/fail check circuit 170.

The control circuit 120 may output a voltage control signal CMDv to control the voltage supply circuit 130 to generate the operating voltages Verase, Vpgm, Vread, Vverify, Vpass, Vdsl, Vssl, and Vsl at desired levels to perform the program loop, the erase loop and the read operation in response to a command signal CMD input through the input/output circuit 160. In addition, the control circuit 120 may output a page buffer control signal CMDpb to control read/write circuits PB, such as, page buffers, included in the read/write circuit group 140 to perform the program loop, the erase loop and the read operation. Furthermore, the control circuit 120 may generate a column address signal CADD and a row address signal RADD based on an address signal ADD.

The voltage supply circuit 130 may generate the operating voltages Verase, Vpgm, Vread, Vverify, Vpass, Vdsl, Vssl, and Vsl used to perform the program loop, the erase loop and the read operation on the memory cells in response to the voltage control signal CMDv. In addition, the voltage supply circuit 130 may output the operating voltages to the local lines SSL, WL0 to WLn, and DSL and the common source line SL of the selected memory block in response to the row address signal RADD.

The voltage supply circuit 130 may include a voltage generator 131 and a row decoder 133. The voltage generator 131 may generate the operating voltages Verase, Vpgm, Vread, Vverify, Vpass, Vdsl, Vssl, and Vsl based on the voltage control signal CMDv. The row decoder 133 may transfer the operating voltages to the local lines SSL, WL0 to WLn, and DSL and the common source line SL of the selected memory block, among the memory blocks 110MB, based on the row address signal RADD.

As describe above, the voltage supply circuit 130 may output and change the operating voltages Verase, Vpgm, Vread, Vverify, Vpass, Vdsi, Vssl, and Vsl based on the voltage control signal CMDv.

The read/write circuit group 140 may include a plurality of read/write circuits PB, such as, page buffers, coupled to the memory array 110 through the bit lines BLe and BLo. The read/write circuits PB may be coupled to the bit lines BLe and BLo. That is, a single read/write circuit PB may be coupled to a single bit line. Additionally, each of the read/write circuits PB may be coupled to each pair of the bit lines BLe and BLo.

In the program operation, the read/write circuits PB may selectively precharge the bit lines BLe and BLo based on the page buffer control signal CMDpb and data DATA to be stored in the memory cells. In the verify operation or the read operation, the read/write circuits PB may precharge the bit lines BLe and BLo, sense voltage changes or currents of the bit lines BLe and BLo, and latch the data read from the memory cells based on the page buffer control signal CMDpb.

The read/write circuits PB may output pass/fail signals FF[0:k] indicating a program pass/fail or an erase pass/fail of the memory cells to the pass/fail check circuit 170 in response to the data read from the memory cells (or threshold voltages of memory cells checked in the verify operation, during the verify operation. The read/write circuits PB may include a plurality of latch circuits that temporarily store data to be stored in the memory cells and store a verify result of the memory cells.

The read/write circuits PB may store a first verify result of the verify operation and a second verify result of the previous verify operation in the latch circuits, and may separately apply the first program allowance voltage and the second program allowance voltage to the bit lines of the program fail memory cells according to the first and second verify results during the program operation.

Figure 3:
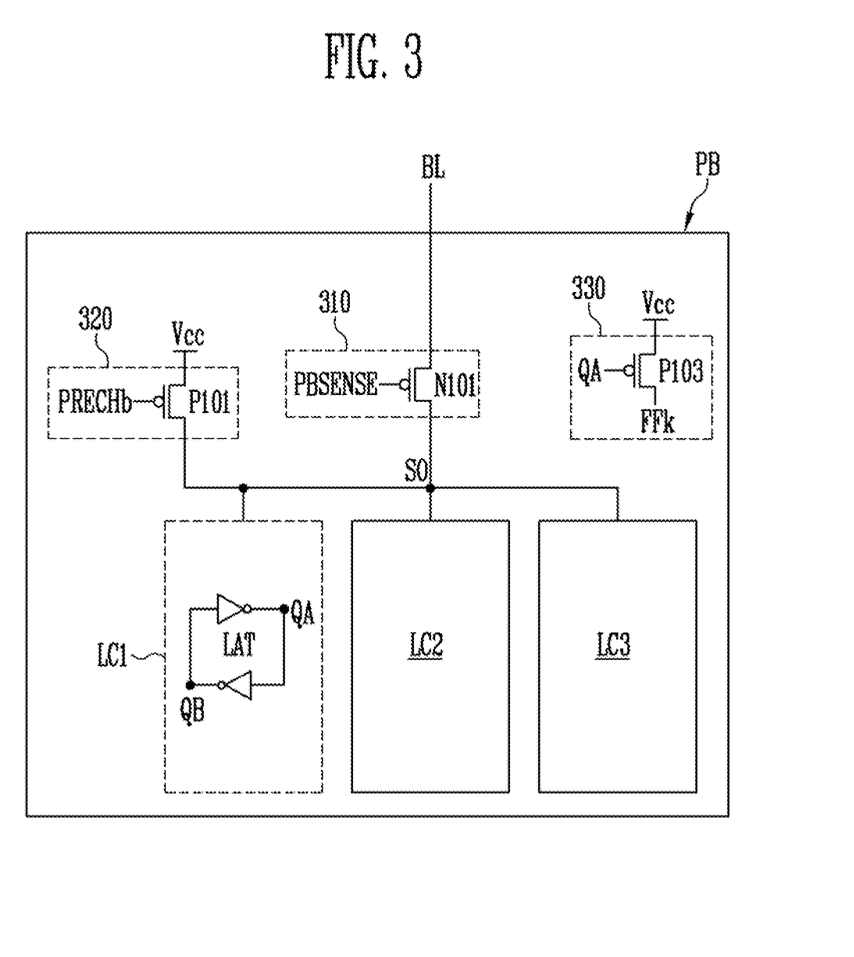
FIG. 3 is a diagram of a read/write circuit shown in FIG. 1.

FIG. 3 is a detailed diagram of the read/write circuit PB shown in FIG. 1.

Referring to FIG. 3, the read/write circuit PB or page buffer may operate based on the page buffer control signal CMDpb shown in FIG. 1. A connection signal PRECHb and a precharge signal PBSENSE may be included in the page buffer control signal CMDpb.

The read/write circuit PB may include a bit line coupling circuit 310, a precharge circuit 320 and latch circuits LC1 to LC3. In addition, the read/write circuit PB may further include a check signal output circuit 330.

The bit line coupling circuits 310 may couple an activated latch circuit, among the latch circuits LC1 to LC3, to the bit line BLe based on a connection signal PBSENSE. The connection signal PBSENSE may be applied at different levels when the bit line BL is precharged and a voltage level of the bit line BL is sensed. The bit line coupling circuit 310 may include a switching device N101 operating based on the connection signal PBSENSE. The latch circuits LC1 to LC3 may be coupled in parallel with the switching device N101. A connecting node between the bit line coupling circuits 310 and the latch circuits LC1 to LC3 may be a sensing node SO.

The precharge circuit 320 may include a switching device P101 coupled between a power supply voltage (Vcc) terminal and the sensing node SO and operating based on a precharge signal PRECHb. The precharge circuit 320 may precharge the sensing node SO. A voltage (Vcc) precharged to the sensing node SO may be used as a precharge voltage for precharging the bit line BL. That is, the precharge circuit 320 may output a precharge voltage to precharge the sensing node SO or the bit line BL.

The number and function of latch circuits LC1 to LC3 may be changed depending on a design purpose. Three latch circuits LC1 to LC3 may be described as an example. In general, one of the latch circuits LC1 to LC3 may be activated. Each of the latch circuits LC1 to LC3 may include a latch LAT.

The first latch circuit LC1 may latch a verify result value corresponding to a result of comparison between a threshold voltage of the memory cell and a target voltage, and output a verify result signal to the first node QA in the verify operation. The first latch circuit LC1 may output an inverted verify result signal to a second node QB.

The second latch circuit LC2 may be used to latch a verify result value obtained in the previous verify operation. When the verify result value is latched to the first latch circuit LC1 in the previous verify operation, the first latch circuit LC1 may transfer the verify result value to the second latch circuit LC2, and the second latch circuit LC2 may latch the verify result value transferred from the first latch circuit LC1. Furthermore, a new verify result value may be latched to the first latch circuit LC1 in the verify operation. Therefore, when the verify operation is completed, the new verify result value may be latched to the first latch circuit LC1, and the verify result value of the previous verify operation may be latched to the second latch circuit LC2.

In the third latch circuit LC3, a program inhibition voltage or a program allowance voltage may be applied to the bit lines based on data externally input through the input/output circuit during the program operation.

A first program allowance voltage and a second program allowance voltage may be selectively applied to bit lines of program pass cells. The first program allowance voltage and the second program allowance voltage may have different levels. It may be determined by the third latch circuit LC3, whether or not to apply the program allowance voltage. Whether the first or second program allowance voltage is applied to the bit lines may be determined by a level of the connection signal PBSENSE.

The check signal output circuit 330 may include a switching device P103 coupled between a power supply terminal and an output node, and operating in response to a signal output from the first node QA of the latch LAT. When a memory cell has a program fail status, a low-level signal may be output from the first node QA of the latch LAT. The check signal output circuit 330 may output a power supply voltage (Vcc) as a verify check signal FFk in response to a potential of the first node QA of the latch LAT. When the memory cell has the program pass status, the check signal output circuit 330 may set the output node, from which the verify check signal FFk is output, to a floating state. That is, any signal may not be output from the output node.

Referring again to FIG. 1, the column selection circuit 150 may select the read/write circuits PB included in the read/write circuit group 140 in response to the column address CADD. The column selection circuit 150 may sequentially transfer data to be stored in memory cells to the read/write circuits PB in response to the column address CADD. In addition, the column selection circuit 150 may sequentially select the read/write circuits PB in response to the column address CADD so that the data of the memory cells latched to the read/write circuits PB may be externally output in the read operation.

The input/output circuit 160 may transfer the command signal CMD and the address signal ADD, which are input from an external device, to the control circuit 120. Additionally, the input/output circuit 160 may transfer the externally input data DATA to the column selection circuit 150 during the program operation, or output the data read from the memory cells to an external device during the read operation.

The pass/fail check circuit 170 may perform a verify operation to determine a program pass/fail or sense the amount of current in response to check signals FF[0:k] output from the read/write circuits PB. The pass/fail check circuit 170 may output a check result signal CHECKs to the control circuit 120 in response to the check signals FF[0:k].

The control circuit 120 may set different operating conditions in a subsequent program operation based on the check result signal CHECKs and the verify result value of the previous verify operation stored in the read/write circuits PB.

Figure 4:
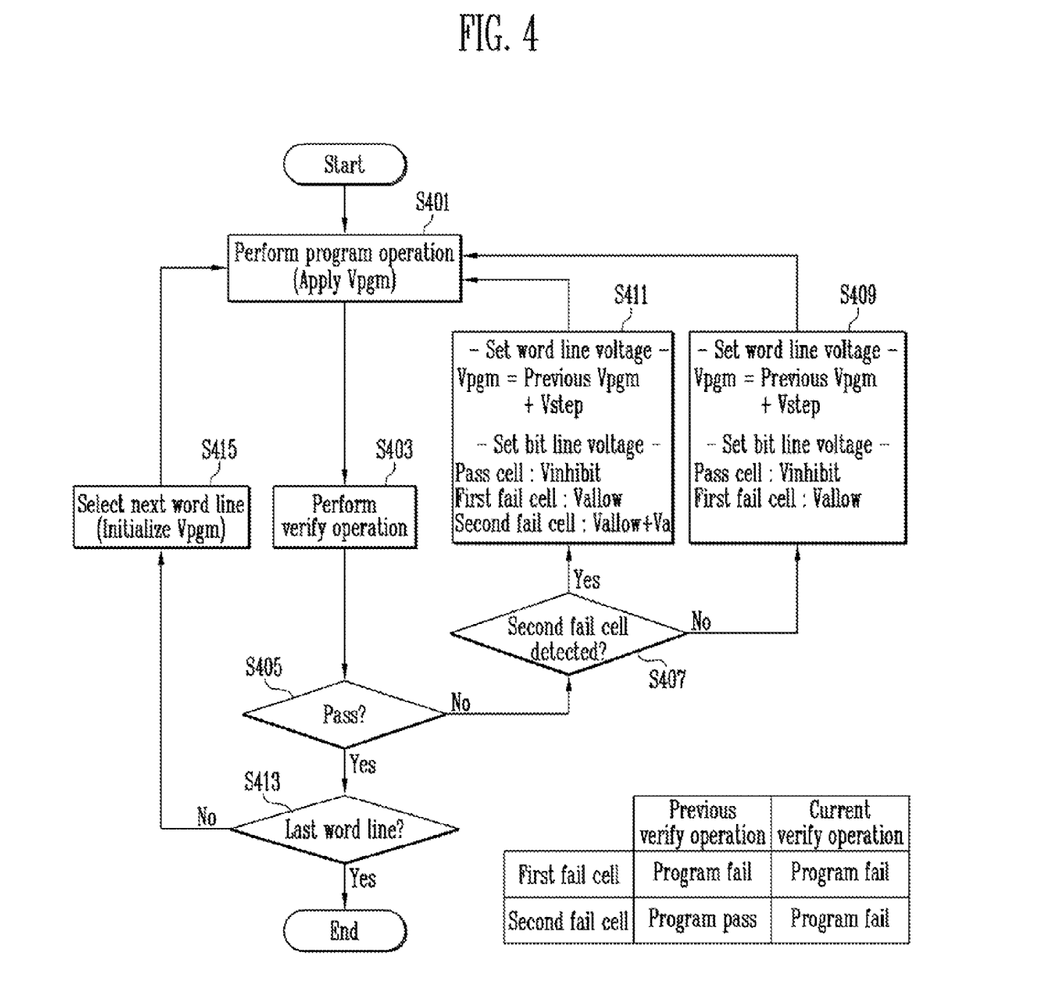
FIG. 4 is a flowchart illustrating a method of operating a semiconductor device according to an embodiment of the present invention.

FIG. 4 is a flowchart Illustrating a method of operating a semiconductor device according to an embodiment of the present invention. FIGS. 5A to 5E are circuit diagrams for describing a method of operating a semiconductor device according to an embodiment of the present invention.

Referring to FIG. 4, an operation circuit may perform a program operation at step S401. To perform the program operation, a program inhibition voltage and a program allowance voltage may be selectively applied to bit lines in response to data stored in memory cells, or according to whether the memory cells are successfully programmed. That is, the program allowance voltage, for example, ground voltage Vgnd, may be applied to a bit line of a program fail cell among program target cells, and the program inhibition voltage, for example, power supply voltage Vcc, may be applied to a bit line of a program inhibit cell or a program pass cell or a successfully programmed cell. In addition, the program voltage Vpgm may be applied to a selected word line. As a result, threshold voltages of some memory cells, such as, program fail cells, may be increased.

Figure 5A:
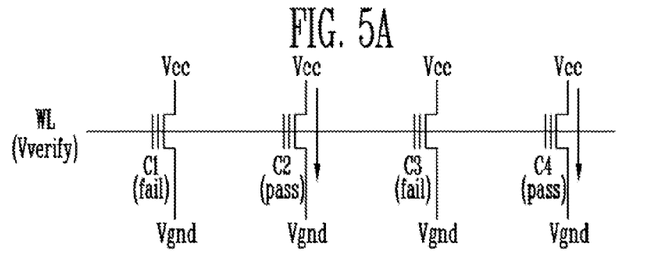
FIGS. 5A to 5E are circuit diagrams for describing a method of operating a semiconductor device according to an embodiment of the present invention.

Referring to FIGS. 4 and 5A, the operation circuit may perform a verify operation to determine a pass/fail of the program operation at step S403. To perform the verify operation, the bit lines may be precharged to a power supply voltage Vcc, and the verify voltage Vverify may be applied to the selected word line. Voltages may be applied to remaining unselected word lines, a drain selection line and a source selection line to turn on unselected memory cells, a drain selection transistor and a source selection transistor, respectively, and a ground voltage Vgnd may be applied to the common source line.

As an example of a result of the verify operation, first and third memory cells C1 and C3 are determined as a program fail, and second and fourth memory cells C2 and C4 are determined as a program pass. The precharge voltage Vcc applied to bit lines of the first and the third memory cells C1 and C3 may remain, and bit lines of second and fourth memory cells C2 and C4 may be reduced to a ground voltage. The operation circuit may sense voltage changes in the bit lines and store a verify result value corresponding to a sensing result in the latch circuit.

The operation circuit may determine whether the data is completely stored in each of the memory cells according to the verify result at step S405. That is, the operation circuit may determine whether the externally provided data coincides with the data stored in the memory cells and determine whether a program fall occurs.

When it is determined that the program fall occurs, it may be checked at step S407 whether there is a program fail cell, hereafter, a second program fail cell, which is determined to have a program pass status in the previous verify operation and determined to have a program fail status in the verify operation at step S403. That is, the second program fail cell may include a memory cell which is checked as having the program pass status in the previous verify operation and changed to the program fail status in the verify operation at step S403. Since the operation circuit, that is, read/write circuit, stores a verify result, hereafter, a second verify result, in the previous verify operation as well as a verify result, hereafter, a first verify result, in the verify operation, the first and second verify results may be checked as to whether the second program fail cell exists.

When the second program fail cell does not exist, a word line voltage and a bit line voltage may be set at step S409. For example, the program voltage Vpgm to be applied to the selected word line in a subsequent program operation may be increased by a predetermined step voltage Vstep. In addition, a voltage to be applied to the bit lines of the first and third memory cells C1 and C3, that is, program fail cells, may be set to a first program allowance voltage Vallow, and a voltage to be applied to bit lines of the second and fourth memory cells C2 and C4 that is, program pass cells, may be set to a program inhibition voltage Vinhibit.

Figure 5B:
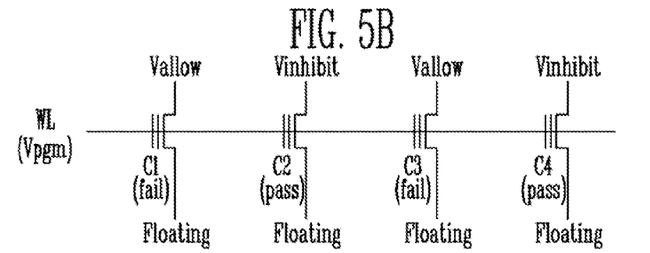

Referring to FIGS. 4 and 5B, at step S401, the operation circuit may perform a program operation according to conditions set at step S409.

Figure 5C:
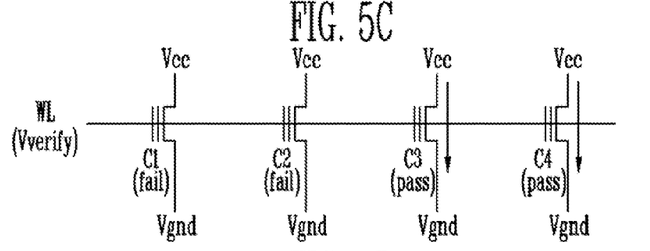

Referring to FIGS. 4 and 5C, the operation circuit may perform a verify operation to check a pass/fail of the program operation at step S403. The verify operation may be performed by the method described above with reference to FIG. 5A. The operation circuit may sense voltage changes in the bit lines and store a verify result value corresponding to a sensing result in the latch circuit.

It is described below as an example, that the third memory cell C3 changes from the program fail status to the program pass status and the second memory cell C2 changes from the program pass status to the program fail status. Therefore, the first and second memory cells C1 and C2 may be determined as a program fail, and the third and fourth memory cells C3 and C4 may be determined as a program pass.

The operation circuit may determine whether the data is completely stored in each of the memory cells according to the verify result at step S405. That is, the operation circuit may check whether the externally input data coincides with the data stored in the memory cells and determine whether a program pass occurs.

When it is determined that the program fall occurs, it may be checked at step S407 whether there is a program fail cell, hereafter, a second program fail cell, that is determined as a program pass in the previous verify operation and determined as the program fail. Since the second memory cell C2 is determined as the program pass in the previous verify operation and as the program fail in the current verify operation, the second memory cell C2 may be the second program fail cell.

Since the second program fail cell exists, a word line voltage and a bit line voltage may be set at step S411. For example, the program voltage Vpgm applied to the selected word line may be increased by the predetermined step voltage Vstep in the subsequent program operation. In addition, a voltage applied to the bit lines of the third and fourth memory cells C3 and C4, that is, program pass cells, may be set to the program inhibition voltage Vinhibit.

A voltage to be applied to the bit lines of the program fail cells C1 and C2 may be set to a program allowance voltage. For example, since the first memory cell C1 is the first program fail cell continuously checked as having the program fail status, a voltage to be applied to the bit line of the first memory cell C1 may be set to the first program allowance voltage Vallow. In addition, since the second memory cell C2 is the second program fail cell, a voltage applied to the bit lines of the second memory cell C2 may be set to a second program allowance voltage Vallow+Va. A voltage applied to the bit lines of the memory cells C3 and C4 checked as a program pass may be set to the program inhibition voltage Vinhibit.

The first program allowance voltage Vallow may be a ground voltage. In addition, the first program allowance voltage Vallow may be lower than the second program allowance voltage Vallow+Va. The difference, that is, Va, between the first program allowance voltage Vallow and the second program allowance voltage Vallow+Va may correspond to the step voltage Vstep. Additionally, the difference between the program inhibition voltage Vinhibit and the second program allowance voltage Vallow+Va may correspond to the step voltage Vstep.

Figure 5D:
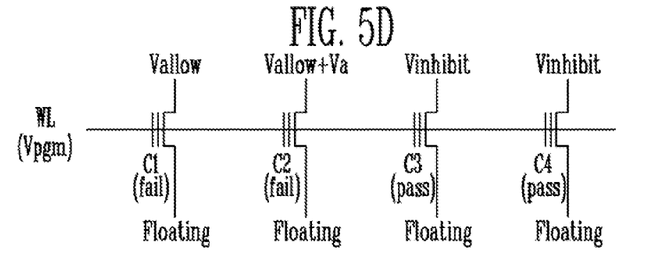

Referring to FIGS. 4 and 5D, at step S401, the operation circuit may perform a program operation according to conditions determined at step S411.

Figure 5E:
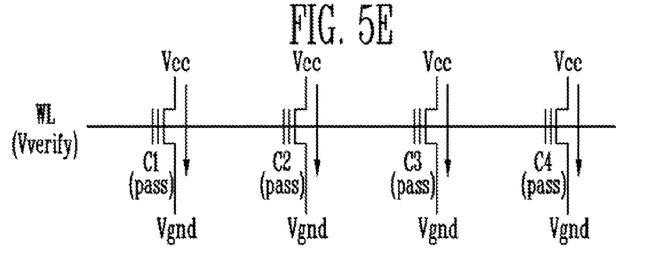

Referring to FIGS. 4 and 5E, the operation circuit may perform a verify operation to check a pass/fail of the program operation at step S403. The verify operation may be performed by the method described with reference to 5A. The operation circuit may sense voltage changes of the bit lines and store a verify result value corresponding to a sensing result in the latch circuit.

An example is described below, in which the first and second memory cells C1 and C2 change from a program fail status to a program pass status. Therefore, the first to fourth memory cells C1 to C4 may be determined as a program pass or a program success.

The operation circuit may determine whether the data is completely stored in each of the memory cells according to a verify result at step S405. That is, the operation circuit may check whether the externally input data coincides with the data stored in the memory cells to determine whether a program pass occurs.

When it is determined that the program pass occurs, it may be checked whether the word line on which the program loop S401 to S411 is performed, is the last word line at step S413. When the word line is not the last one, a next word line may be selected at step S415, and the program voltage Vpgm may be initialized. The program voltage Vpgm increased in the previous program loop may be reduced to an initial level for a program loop of the next word line. The program loop of the subsequent word line may be performed according to the above steps S401 to S411. When the word line is determined as the last word line, the program loop may be terminated.

As described above, even when a threshold voltage of a memory cell for example, C2, which is determined as a program pass in the previous verify operation and subsequently determined as a program fail in the current verify operation, is increased higher than a target level, a relatively small difference may occur therebetween. Therefore, the memory cell may again be determined as the program fail in the verify operation of FIG. 5C. As a result, the program operation may be performed again on the second memory cell C2. However, when the program operation is performed under the same conditions as the general program fail cell for example, C1, the threshold voltage of the second memory cell C2 may be increased much higher than the target level. Therefore, in the program operation, the increase of the threshold voltage may be reduced by increasing the program allowance voltage Vallow+Va to be slightly greater than the program allowance voltage Vallow applied to the bit line of the second memory cell C2. As a result, the threshold voltage of the second memory cell C2 may be prevented from being increased much higher than the target level, so that a threshold voltage distribution width may be reduced. In addition, the data stored in the memory cells may be prevented from being changed.

Figure 6:
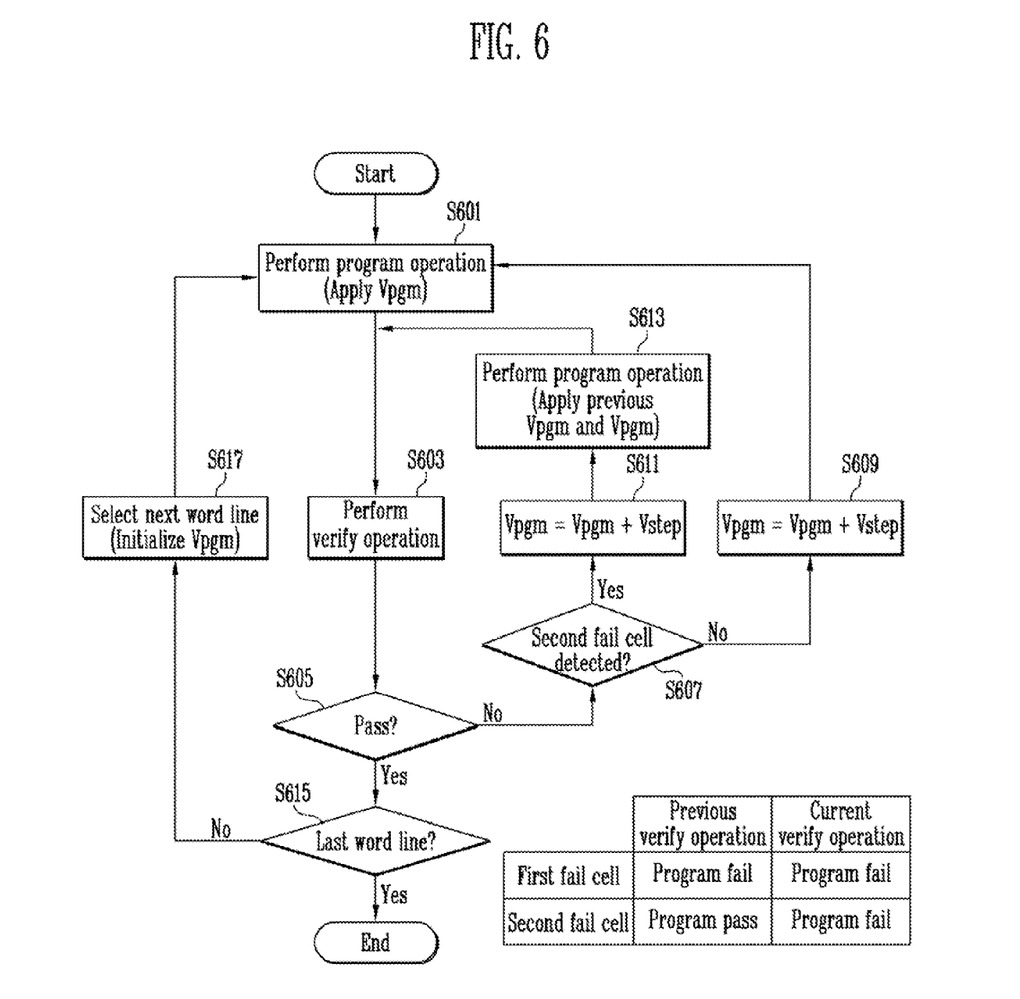
FIG. 6 is a flowchart illustrating a method of operating a semiconductor device according to another embodiment of the present invention.

Hereinafter, another program loop method for an under program cell, which is determined as a program pass in the previous verify operation and subsequently determined as a program fail in the current verify operation, will be described. FIG. 6 is a flowchart illustrating a method of operating a semiconductor device according to another embodiment of the present invention. FIGS. 7A to 7E are circuit diagrams for describing a method of operating a semiconductor device according to an embodiment of the present invention.

Figure 7A:
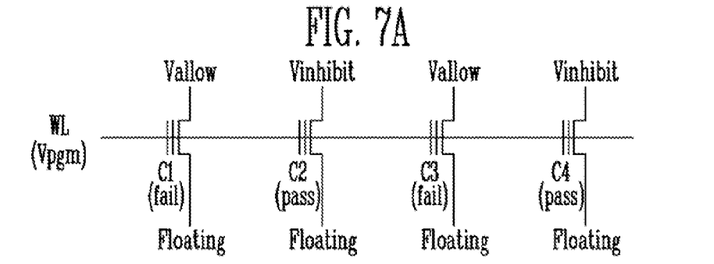
FIGS. 7A to 7E are circuit diagrams for describing a method of operating a semiconductor device according to an embodiment of the present invention.

Referring to FIGS. 6 and 7A, the operation circuit may perform a program operation at step S601. To perform the program operation, a program inhibition voltage and a program allowance voltage may be selectively applied to bit lines in response to data stored in the memory cells or according to whether the memory cells are successfully programmed. That is, the program allowance voltage Vallow may be applied to bit lines of program fail cells C1 and C3, among program target cells, and the program inhibition voltage Vinhibit may be applied to bit lines of a program inhibit cell or program pass cells or successfully programmed cells such as C2 and C4. In addition, the program voltage Vpgm may be applied to the selected word line. As a result, threshold voltages of some memory cells for example, program fail cells C1 and C3, may be increased.

Figure 7B:
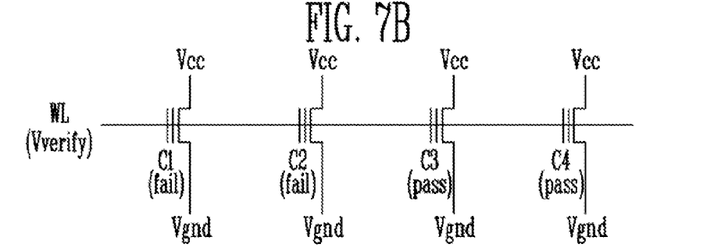

Referring to FIGS. 6 and 7B, the operation circuit may perform a verify operation to check a pass/fail of the program operation at step S603. The verify operation may be performed by the method described above with reference to FIG. 5A. The operation circuit may sense voltage changes in the bit lines and store a verify result value corresponding to a sensing result in the latch circuit. When the verify operation is performed, the operation circuit may check both a program state of a memory cell checked as a program fail in the previous verify operation and a program state of a memory cell checked first as a program pass.

An example is described below in which the third memory cell C3 changes from the program fail status to the program pass status and the second memory cell C2 changes from the program pass status to the program fail status. Therefore, the first and second memory cells C1 and C2 may be determined as a program fail, and the third and fourth memory cells C3 and C4 may be determined as a program pass.

The operation circuit may determine whether the data is completely stored in each of the memory cells according to the verify result at step S605. That is, the operation circuit may check whether externally input data and the data stored in the memory cells coincide with each other and determine whether a program pass occurs.

When it is determined that the program fail occurs, it may be checked whether there is a program fail cell, hereafter, a second program fail cell, which is determined as a program pass in the previous verify operation and subsequently determined as the program fail in the current verify operation at step S607. The second program fail cell may include a memory cell which is checked as having the program pass status in the previous verify operation and changed to the program fail status in the verify operation at step S603.

When the second program fail cell does not exist, a word line voltage may be set at step S609. For example, the program voltage Vpgm to be applied to the selected word line in a subsequent program operation may be increased by the predetermined step voltage Vstep. At step S601, the operation circuit may perform the program operation according to conditions set at step S609. Subsequently, steps S603 to S607 may be performed.

However, since the second memory cell C2 is determined as the program pass in the previous verify operation and as the program fail in the current verify operation, the second memory cell C2 may be the second program fail cell. That is, it may be checked that the second program fall cell is detected at step S607. For reference, since the first memory cell C1 maintains or keeps the program fail status, the first memory cell C1 may be the first program fall cell. The first program fall cell may include a memory cell which is checked as having the program fail status both in the previous verify operation and the verify operation at step S603.

Since the second program fail cell C2 exists, the program operation may be performed under different conditions. First, a word line voltage may be set at step S611. For example, the program voltage Vpgm to be applied to the selected word line in a subsequent program operation may be increased by the predetermined step voltage Vstep. In addition, a voltage to be applied to bit lines of the third and fourth memory cells C3 and C4, that is, program pass cells, may be set to the program inhibition voltage Vinhibit.

Figure 7C:
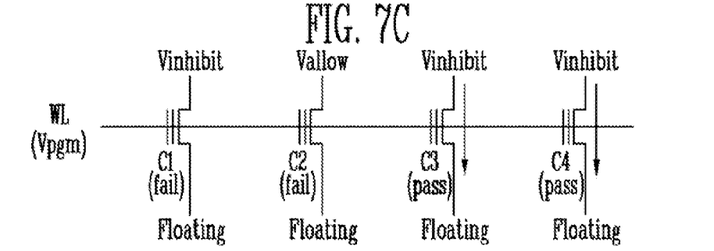

Referring to FIGS. 6 and 7C, the operation circuit may perform the program operation at step S613. During the program operation, the operation circuit may apply a first program voltage Vpgm to program the second program fail cell C2 and a second program voltage, that is, previous Vpgm+Vstep, to program the first program fall cell C1 to a word line. The first program voltage Vpgm is a voltage that is applied to the word line in the previous program operation and corresponds to a program voltage before step S611 at which the program voltage is increased by the step voltage Vstep. The second program voltage, that is, previous Vpgm+Vstep, is a voltage that is set at step S611 and corresponds to a program voltage higher than the program voltage Vpgm of the previous program operation by the step voltage Vstep.

First, the first program voltage Vpgm may be applied to the selected word line. When the first program voltage Vpgm is applied, the operation circuit may apply the program allowance voltage Vallow to the bit line of the second program fail cell C2 and the program inhibition voltage Vinhibit to remaining bit lines. Therefore, only the threshold voltage of the second program fail cell C2 may be increased by the first program voltage Vpgm.

Figure 7D:
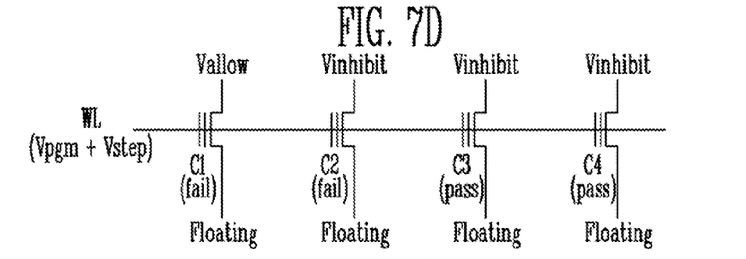

Then, referring to FIGS. 6 and 7D, after the first program voltage Vpgm is applied to the word line at step S613, the second program voltage, that is, previous Vpgm+Vstep, may be applied to the word line. When the second program voltage, that is, previous Vpgm+Vstep, is applied, the operation circuit may apply the program allowance voltage Vallow to the bit line of the first program fail cell C1, and the program inhibition voltage Vinhibit to the remaining bit lines. Therefore, only the threshold voltage of the first program fail cell C1 may be increased by the second program voltage, that is, previous Vpgm+Vstep.

As described above, the program operation of the first and second program fail cells C1 and C2 may continue to be performed by using different program voltages for example, Vpgm and Vpgm+Vstep). After the second program voltage, that is, previous Vpgm+Vstep, is applied, the first program voltage Vpgm may be performed. After the program operation is performed on the first program fail cell C1, the program operation may be performed on the second program fail cell C2.

Figure 7E:
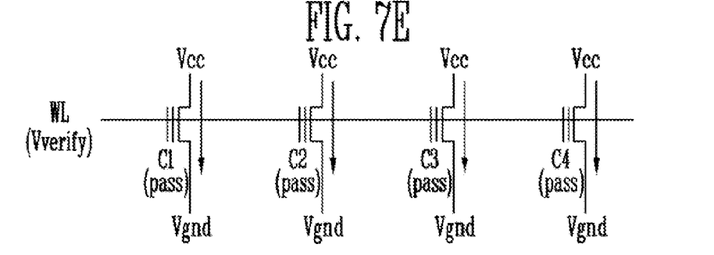

Referring to FIGS. 6 and 7E, the operation circuit may perform a verify operation to check a pass/fail of the program operation at step S603. The verify operation may be performed by the method described above with reference to FIG. 5A. The operation circuit may sense voltage changes in the bit lines and store a verify result value corresponding to a sensing result in the latch circuit.

It is described below as an example that the first and second memory cells C1 and C2 change from the program fail status to the program pass status. Thus, the first to fourth memory cells C1 to C4 may be determined as a program pass.

The operation circuit may determine whether data is completely stored in each of the memory cells according to the verify result at step S605. The operation circuit may check whether externally input data coincides with the data stored in the memory cells and determine whether a program pass occurs.

When it is determined that the program pass occurs, it may be checked whether the word line on which the program loop S601 to S613 is performed is the last word line at step S615. When the word line is not the last one, the next word line may be selected, and the program voltage Vpgm may be initialized at step S617. The program voltage Vpgm increased in the previous program loop may be reduced to an initial level for a program loop of the next word line. Subsequently, the program loop of the next word line may be performed according to the above-described steps S601 to S613. When the word line is determined as the last word line, the program loop may be terminated.

As described above, even when the threshold voltage of the memory cell, for example, C2, which is determined as the program pass in the previous verify operation and subsequently determined as the program fail in the current verify operation, is increased higher than the target level, when a difference between the threshold voltage and the target level is small may occur, the memory cell C2 may be determined again as the program fall cell in a verify operation shown in FIG. 7B. Therefore, the program operation of the second memory cell C2 may be performed again. However, if the program operation is performed again under the same conditions as the general program fail cell, for example, C1, the threshold voltage of the second memory cell C2 may be increased much higher than the target level. Therefore, when the program operation of the second memory cell C2 is additionally performed by applying the previous program voltage Vpgm to the word line of the second memory cell C2. The previous program voltage Vpgm may be lower than the program voltage that is, Vpgm+Vstep, to be applied to the word line of the first memory cell C1 in the program operation. Therefore, the threshold voltage of the second memory cell C2 may be increased at a lower rate. As a result, the threshold voltage of the second memory cell C2 may be prevented from being increased much higher than the target level, so that a threshold voltage distribution width may be reduced. In addition, the data stored in the memory cell may be prevented from being changed.

Figure 8:
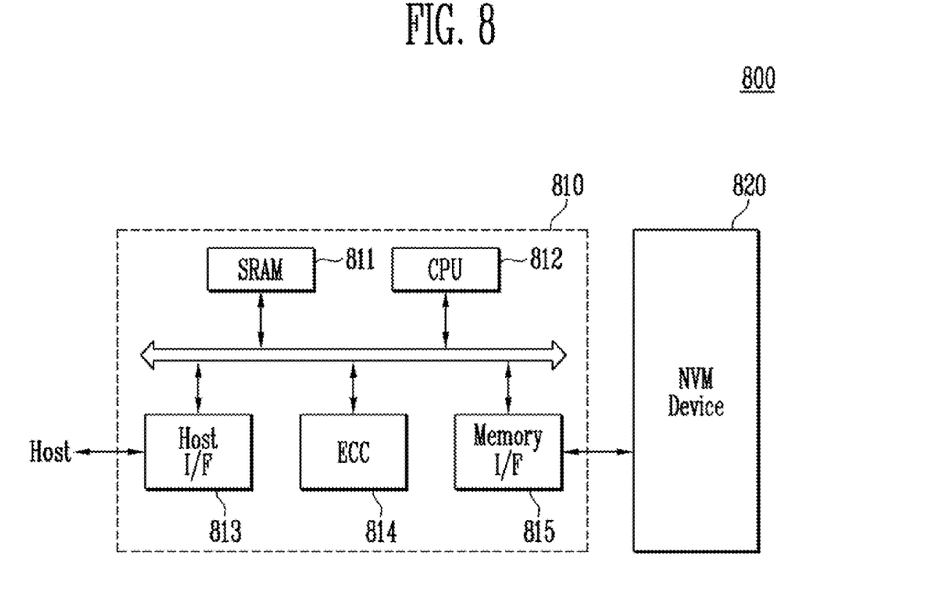
FIG. 8 is a block diagram illustrating a memory system according to an embodiment of the present invention.

FIG. 8 is a block diagram illustrating a memory system 800 according to an embodiment of the present invention.

As illustrated in FIG. 8, the memory system 800 according to an embodiment of the present invention may include a non-volatile memory (NVN) device 820 and a memory controller 810.

The non-volatile memory device 820 may include the semiconductor device according to the above-described embodiments of the present invention. The memory controller 810 may control the non-volatile memory device 820. The memory system 800 may be a memory card or a solid-state disk (SSD) in which the non-volatile memory device 820 and the memory controller 810 are combined. The memory controller 810 may include a static random access memory (SRAM) 811, a central processing unit (CPU) 812, a host interface (I/F) 813, an error correction code (ECC) 814, and a memory I/F 815. The SRAM 811 may function as an operation memory of the CPU 812. The host interface 813 may include a data exchange protocol of a host coupled to the memory system 800. The ECC 814 may detect and correct errors included in a data read from the non-volatile memory device 820. The memory interface 815 may interface with the non-volatile memory device 820. The CPU 812 may perform the general control operation for data exchange of the memory controller 810.

Though not illustrated in FIG. 8, the memory system 800 may further include ROM (not illustrated) that stores code data to interface with the host. In addition, the non-volatile memory device 820 may be a multi-chip package composed of a plurality of flash memory chips. The memory system 800 may be provided as a storage medium having high reliability and low error rate. The flash memory according to an embodiment of the present invention may be provided in a memory system such as a semiconductor disk device, for example, an SSD. When the memory system 800 is an SSD, the memory controller 810 may communicate with the outside, such as, a host, through one of the interface protocols including USB, MMC, PCI-E, SATA, PATA, SCSI, ESDI and IDE.

Figure 9:
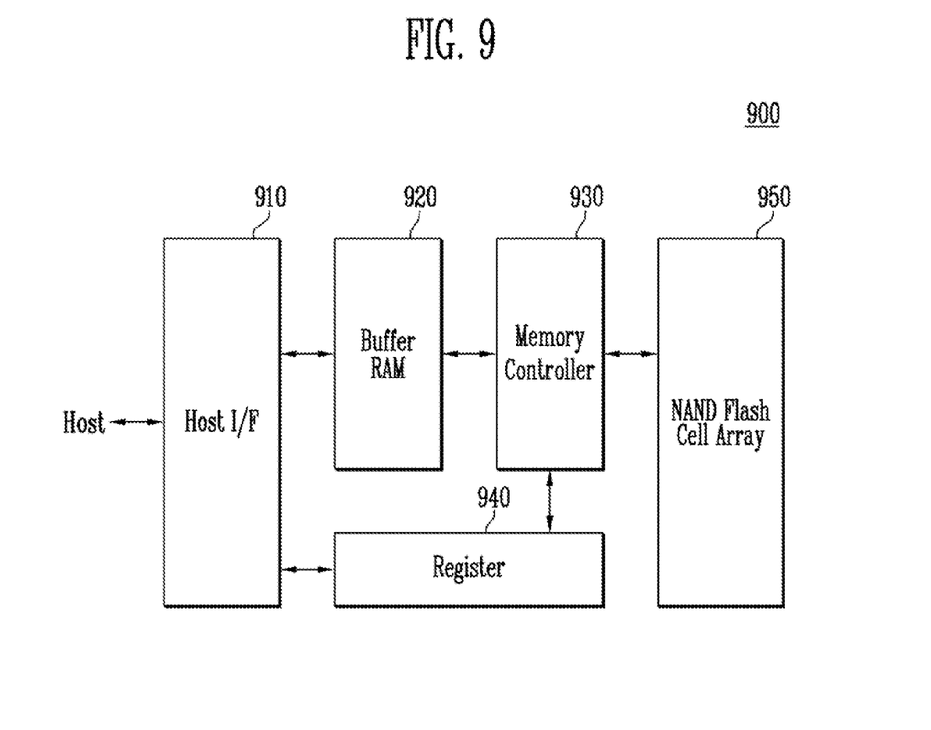
FIG. 9 is a block diagram illustrating a fusion memory device or a fusion memory system performing an operation according to the earlier described various embodiments of the present invention.

FIG. 9 is a block diagram Illustrating a fusion memory device or a fusion memory system that performs an operation according to the aforementioned various embodiments of the present invention. For example, technical features of the present invention may be applied to a OneNand flash memory 900 as the fusion memory device.

The OneNand flash memory 900 may include a host I/F 910, a buffer RAM 920, a memory controller 930, a register 940 and a NAND flash cell array 950. The host I/F 910 may exchange various types of information with a device through a different protocol. The buffer RAM 920 may have built-in codes for driving the memory device or temporarily store data. The memory controller 930 may control read and program operations and every state based on a control signal and a command that are externally given. The register 940 may store data including instructions, addresses and configurations defining a system operating environment in the memory device. The NAND flash cell array 950 may include operating circuits including non-volatile memory cells and page buffers. The memory array shown in FIG. 2 may be used as the memory array of the NAND flash cell array 950.

Figure 10:
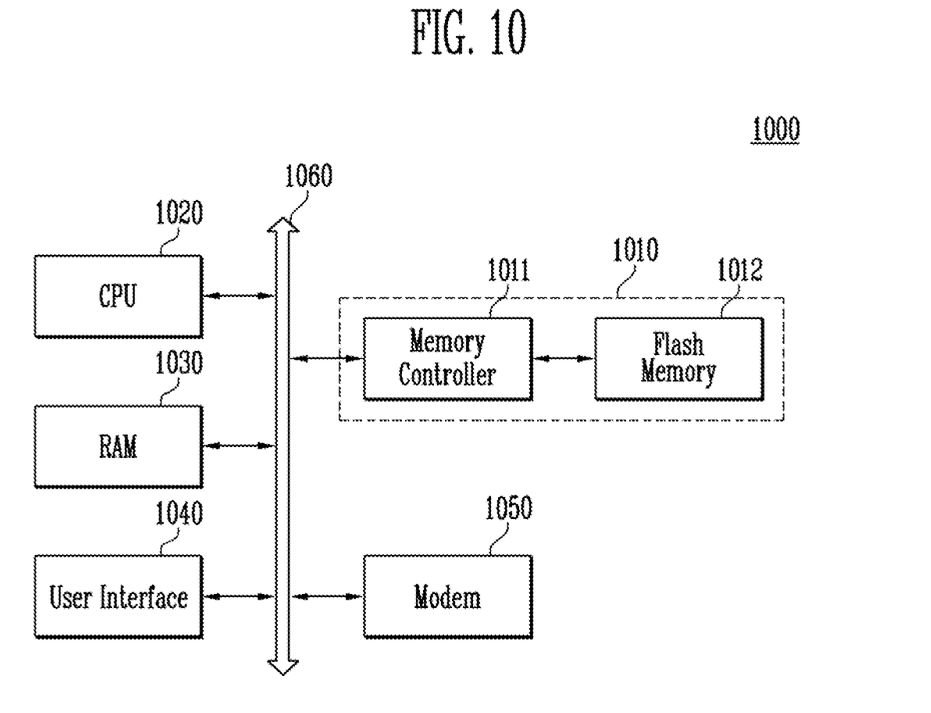
FIG. 10 is a block diagram illustrating a computing system including the flash memory according to an embodiment of the present invention.

FIG. 10 is a block diagram illustrating a computing system 1000 including the flash memory 1012 according to an embodiment of the present invention.

Referring to FIG. 10, the computing system 1000 may include a microprocessor, such as, a CPU 1020, a RAM 1030, a user interface 1040, a modem 1050 such as, a baseband chipset, and a memory system 1010 that are electrically coupled to a system bus 1060. Additionally, if the computing system 1000 is a mobile device, then a battery may be provided to apply operating voltages to the computing system 1000. Though not shown in FIG. 10, the computing system 1000 may further include application chipsets, a camera image processor, or mobile DRAM. The memory system 1010 may include a memory controller and a flash memory 1012. The memory system 1010 may form a SSD that uses a non-volatile memory to store data. The memory system 1010 may be provided as a fusion flash memory, such as, a OneNAND flash memory.

According to the embodiments of the present invention, operation reliability of a semiconductor device may be improved.

Although various embodiments have been described for illustrative purposes, it will be apparent to those skilled in the art that various changes and modifications may be made without departing from the spirit and scope of the invention as defined in the following claims.

What is claimed is:

1. A semiconductor device, comprising:
   a memory block including memory cells coupled to word lines; and
   an operation circuit suitable for performing a program operation and a verify operation on memory cells coupled to a selected word line,
   wherein, when performing the program operation, the operation circuit applies a first program allowance voltage to a bit line of a first program fail cell, to keep a program fail status, and a second program allowance voltage having a voltage level different from the first program allowance voltage to a bit line of a second program fail cell, to change a program pass status to a program fall status.

2. The semiconductor device of claim 1, wherein the second program allowance voltage is higher than the first program allowance voltage.

3. The semiconductor device of claim 1, wherein the operation circuit repeats the program operation and the verify operation by using an incremental step pulse program (ISPP).

4. The semiconductor device of claim 3, wherein the operation circuit applies a program voltage higher than a program voltage applied in a previous program operation by a step voltage to the selected word line during the program operation.

5. The semiconductor device of claim 4, wherein a voltage difference between the second program allowance voltage and the first program allowance voltage is the same as the step voltage.

6. The semiconductor device of claim 3, wherein, when the verify operation is performed, the operation circuit checks both a program state of a memory cell determined to have a program fall status in a previous verify operation and a program state of a memory cell determined to be changed to a program pass status.

7. The semiconductor device of claim 3, wherein the first program fail cell is determined to have a program fail status both in a previous verify operation and a current verify operation.

8. The semiconductor device of claim 3, wherein the second program fail cell is determined to have a program pass status in a previous verify operation and determined to have a program fail status in a current verify operation.

9. The semiconductor device of claim 1, wherein the operation circuit applies a program inhibition voltage to a bit line of a third memory cell determined as a program pass, during the program operation.

10. The semiconductor device of claim 9, wherein a voltage difference between the program inhibition voltage and the second program allowance voltage corresponds to a voltage difference between a program voltage applied in a current program operation and a program voltage applied in a previous program operation.

11. A semiconductor device, comprising:
   a memory block including memory cells coupled to word lines; and
   an operation circuit suitable for performing a program operation and a verify operation on memory cells coupled to a selected word line,
   wherein, when a first program fail cell is determined to have a program fail status, and a second program fall cell is determined to have been changed from a program pass status to a program fail status are detected in the verify operation, the operation circuit applies a first program voltage to program the second program fall cell and a second program voltage to program a first program fail cell to the selected word line in the program operation.

12. The semiconductor device of claim 11, wherein the operation circuit applies a program allowance voltage to a bit line of the second program fail cell and a program inhibition voltage to remaining bit lines when applying the first program voltage.

13. The semiconductor device of claim 11, wherein the operation circuit applies a program allowance voltage to a bit line of the first program fail cell and a program inhibition voltage to remaining bit lines when applying the second program voltage.

14. The semiconductor device of claim 11, wherein the operation circuit repeats the program operation and the verify operation by using an incremental step pulse program (ISPP).

15. The semiconductor device of claim 14, wherein the first program voltage has substantially the same level as a program voltage applied to the selected word line in a previous program operation.

16. The semiconductor device of claim 14, wherein the second program voltage is higher than the first program voltage by a step voltage.

17. The semiconductor device of claim 14, wherein the operation circuit sequentially applies the first program voltage and the second program voltage to the selected word line and subsequently performs the verify operation.

18. The semiconductor device of claim 14, wherein, when the verify operation is performed, the operation circuit checks both a program state of a memory cell determined to have a program fail in a previous verify operation and a program state of a memory cell determined first as a program pass in a current verify operation when performing the verify operation.

19. The semiconductor device of claim 14, wherein the first memory cell is determined to have a program fail status both in a previous verify operation and a current verify operation.

20. The semiconductor device of claim 14, wherein the second memory cell is determined to have a program pass status in a previous verify operation and determined to have a program fail status in a current verify operation.

* * * * *

UNITED STATES PATENT AND TRADEMARK OFFICE
CERTIFICATE OF CORRECTION

PATENT NO. : 9,263,148 B2
APPLICATION NO. : 14/572071
DATED : February 16, 2016
INVENTOR(S) : Chi Wook An et al.

Page 1 of 1

It is certified that error appears in the above-identified patent and that said Letters Patent is hereby corrected as shown below:

Claims

Change the Claims section as follows:

Column 14, line 48
9. The semiconductor device of claim 1, wherein the operation circuit applies a program inhibition voltage to a bit line of a memory cell determined as a program pass, during the program operation.

Column 16, line 14
19. The semiconductor device of claim 14, wherein the first program fail cell is determined to have a program fail status both in a previous verify operation and a current verify operation.

Column 16, line 17
20. The semiconductor device of claim 14, wherein the second program fail cell is determined to have a program pass status in a previous verify operation and determined to have a program fail status in a current verify operation.

Signed and Sealed this
Seventeenth Day of May, 2016

Michelle K. Lee
*Director of the United States Patent and Trademark Office*